(12) United States Patent
De Boer et al.

(10) Patent No.: US 6,908,691 B2
(45) Date of Patent: Jun. 21, 2005

(54) METAL STRIP FOR EPITAXIAL COATINGS AND METHOD FOR THE PRODUCTION THEREOF

(75) Inventors: Bernd De Boer, Altena (DE); Bernhard Holzapfel, Kreischa (DE); Gunter Risse, Dresden (DE)

(73) Assignee: Institut fuer Festkoerper-und Werkstoffforschung Dresden e.V., Dresden (DE)

( * ) Notice: Subject to any disclaimer, the term of this patent is extended or adjusted under 35 U.S.C. 154(b) by 71 days.

(21) Appl. No.: 10/432,445

(22) PCT Filed: Dec. 5, 2001

(86) PCT No.: PCT/DE01/04648
§ 371 (c)(1),
(2), (4) Date: Jul. 31, 2003

(87) PCT Pub. No.: WO02/46108
PCT Pub. Date: Jun. 13, 2002

(65) Prior Publication Data
US 2005/0031890 A1 Feb. 10, 2005

(30) Foreign Application Priority Data
Dec. 7, 2000 (DE) .......................... 100 61 398
Dec. 7, 2000 (DE) .......................... 100 61 399

(51) Int. Cl.$^7$ .................. B32B 15/00; C22C 19/03; C23C 8/00
(52) U.S. Cl. ............ 428/615; 428/637; 428/668; 428/671; 428/577; 428/687; 428/929; 148/206; 148/207; 148/409; 148/411; 148/426; 148/430; 148/431; 148/432; 148/435; 505/470; 505/473; 505/490; 505/500
(58) Field of Search ............. 428/615, 577, 428/637, 668, 671, 687, 929; 148/206, 207, 279, 282, 284, 286, 409, 411, 426, 430, 431, 432, 435; 505/470, 473, 490, 500

(56) References Cited
U.S. PATENT DOCUMENTS
3,296,695 A * 1/1967 Coxe et al. .................. 428/577
6,458,223 B1 * 10/2002 Hans Thieme et al. ...... 148/435

FOREIGN PATENT DOCUMENTS
DE 100 05 861 A1 * 10/2000 .......... C22C/19/03
EP 0 884 787 A2 * 12/1998 .......... H01L/39/24
WO WO-99/17307 A1 * 4/1999 .......... H01B/12/02

OTHER PUBLICATIONS
Lockman, Z., et al: "Study of Thermal Oxidation of NiO Buffers on Ni–Based Tapes For Superconductor Substrates", Physica C, North–Holland Publishing, Amsterdam, NL, vol. 351, Nr. 1, pp. 34–37, (no date given).*

* cited by examiner

Primary Examiner—Robert R. Koehler
(74) Attorney, Agent, or Firm—Jordan and Hamburg LLP

(57) ABSTRACT

The aim of the invention is to provide a metal strip for epitaxial coating with a biaxially textured layer, this metal strip, however, being able to be produced in an uncomplicated manner and having a high tensile strength, low magnetic losses and/or a high electrical conductivity. According to the invention, the metal strip is comprised of Nj, Cu, Ag or alloys thereof all serving as basic material, whereby the one-layer metal strip and, in the instance of a multilayer metal strip, at least one of its layers contains 10 nm to 5 μm large, strength-increasing dispersoids comprised of carbides, borides, oxides and/or nitrides with a volume proportion ranging from 0.1 to 5%. In the instance of a multilayer metal strip, the layers form a composite, and at least one of the layers does not contain any dispersoids and has a biaxial texture. For the production, a starting material is used, which is comprised of Ni, Cu, Ag or of alloys thereof all serving as basic material and which contains 0.2 to 5 atom percent of an additive comprised of oxidizable, nitridable, boridable and/or carbidable elements. A one-layer or a multilayer strip is produced from this starting material by means of deforming methods, whereby for producing the multilayer metal strip, a basic material that does not contain the aforementioned additive is used as one of its layers. Afterwards, the strip is subjected to a recrystallization annealing in order to form a cubical texture. Finally, the strip is subjected to an annealing under an oxygen, nitrogen, boron or carbon partial pressure, which is greater than the equilibrium partial pressure of oxides, nitrides, borides and carbides of the additive elements contained in the alloy, but is less than the equilibrium partial pressure of oxides, nitrides, borides and carbides of the basic elements Ni, Cu and Ag of the strip alloy.

10 Claims, No Drawings

METAL STRIP FOR EPITAXIAL COATINGS AND METHOD FOR THE PRODUCTION THEREOF

BACKGROUND OF THE INVENTION

The invention relates to a single layer or multi-layer metal strip for the epitaxial coating with a biaxially textured layer and to a method for producing such metal strip. Such strip can be used advantageously as a backing strip for the deposition of biaxially textured layers of $YBa_2Cu_3O_x$ superconducting material.

A metal strip, based on Ni, Cu and Ag, which is suitable for the epitaxial coating with a biaxially textured layer, is already known (U.S. Pat. Nos. 5,739,086, 5,741,377, 5,964,966 and 5,968,877). It is produced by cold rolling with a degree of deformation of more than 95% and subsequent recrystallization annealing, a sharp {001} <100> texture (cubic texture) being formed.

Intensive work, particularly relating to the development of substrate materials based on Ni and Ag, is currently being carried out worldwide (J. E. Mathis et al., Jap. J. Appl. Phys. 37, 1998; T. A. Gladstone et al., Inst. Phys. Conf. Ser. No. 167, 1999).

One of the substrate materials developed consists of a nickel alloy, which is composed of $Ni_a(Mo_b,W_c)_dM_e$, in which M represents one or more metals other than Ni, Mo or W (DE 100 05 861 A1). In order to produce this material, initially an alloy of said composition is produced by melt metallurgy or powder metallurgy or by mechanical alloying and processed by thermoforming and by a subsequent, high quality, cold forming into a strip. This is subjected in a reducing or nonoxidizing atmosphere to a recrystallizing annealing. In comparison to technically pure nickel, the material has a higher grade, cubic texture, which is thermally more stable, and can be used as a substrate for physical, chemical coatings with a higher grade, microstructural orientation.

In the case of such materials, efforts are made to increase the strength. This is realized either by mixed crystal tempering, for which a nickel alloy with typically more than 5% of one or more alloying elements is rolled and recrystallized (U.S. Pat. No. 5,964,966; G. Celentano et al., Int. Journal of Modern Physics B, 13, 1999, page 1029, R. Nekkanti et al. Presentation at the Applied Supercond. Conf., Virginia Beach, Va., Sep. 17–27, 2000) or by rolling and recrystallizing a composite of nickel and a material of higher tensile strength (T. Watanabe et al., Presentation at the Applied Supercond. Conf., Virginia Beach, Va., Sep. 17–27, 2000).

For mixed crystal tempering, there is a critical degree of alloying, above which the cubic texture can no longer be formed. This phenomenon has been investigated intensively for brass alloys (Cu—Zn alloys with an increasing zinc content) and appears to be generally valid (H. Hu et al., Trans. AIME, 227, 1963, page 827, G. Wassermann, J. Grewen: Texturen metallischer Werkstoffe (Textures of Metallic Materials), Springer-Verlag Berlin/Göttingen/Heidelberg). Since the strength increases steadily with the alloy concentration, a maximum strength is also associated therewith. The second limitation is the high strength of the material already during the shaping by rolling. As a result, very large rolling forces arise already during the necessarily high degree of transformation so that, on the one hand, increased demands must be made on the rolling mill and, on the other, it becomes technically more difficult to carry out the exceptionally homogeneous deformation by rolling, which is required for forming the necessary, high-grade cubic texture.

When the strength of a composite of a Ni, Cu or Ag alloy with a material of higher strength is increased by rolling, there is also the problem of the high rolling forces when a material of great strength is deformed extensively. Because of the differences in the mechanical properties of the two materials, forming the composite, shear stresses occur at the interface during the rolling process and, with that, inhomogeneities in the deformation microstructure, which lower the cubic texture quality achievable during the recrystallization process.

One possibility of increasing the strength of a metallic matrix is the known dispersion tempering, for which preferably ceramic particles, finely dispersed in the matrix, are used. The particles can be introduced by powder metallurgical means or generated in situ by an exothermic reaction.

However, materials, produced in this manner, are not suitable for being processed by rolling and recrystallizing into a thin, biaxially textured strip. On the one hand, they already have a very high strength during the rolling and, on the other, it has not yet been possible to demonstrate the formation of strongly pronounced cubic texture, suitable for the application, in a dispersoid-containing strip.

Besides endeavors to increase the strength, efforts have been made to develop nonmagnetic substrates, in order to avoid hysteresis losses in alternating current applications (U.S. Pat. No. 5,964,966). Moreover, there have been attempts to use the substrate strip for stabilizing the current-carrying superconducting layer as a bypass (C. Cantoni et al., Presentation at the Applied Supercond. Conf., Virginia Beach, Va., Sep. 17–22, 2000). In order to realize this function, the substrate must have the highest possible electrical conductivity.

SUMMARY OF THE INVENTION

It is an object of the invention to create a metal strip for the epitaxial coating with. a biaxially textured layer, which has a high tensile, low magnetic losses and/or a high electric conductibility. It is furthermore an object of the invention to provide a method for producing such strip, which can be carried out without any problems.

DESCRIPTION OF THE PREFERRED EMBODIMENTS

Pursuant to the invention, this objective is accomplished with a single-layer or multi-layer metal strip and the associated production process.

Pursuant to the invention, the metal strip consists of nickel copper, silver or their alloys as basic materials, the single-layer metal strip and, in the case of a multi-layer metal strip, at least on of its layers containing strength-increasing dispersoids, 10 nm to 5 $\mu$m in size, of carbides, borides, oxides and/or nitrides in an amount of 0.1% to 5% by volume, the layers of the multi-layer metal strip forming a composite and at least one of the layers being free of dispersoid and having a biaxial texture.

The layers of the multi-layer metal strip may consist of a uniform basic material or, in at least one of the layers, may differ from the others with respect to the basic material.

According to an appropriate development, the dispersoid-containing layer consists of copper, a copper alloy or a nickel alloy and the dispersoid-free, biaxially textured layer consists of nickel or a nickel alloy as a basic material.

The carbide dispersoids may consist of $Cr_4C$, $Cr_7C_3$, $Cr_3C_2$, $B_4C$, WC, $Mo_2C$, VC, NbC, TaC and/or TiC.

The boride dispersoids may consists of $AlB_{12}$, $ZrB_2$, $Co_3B$, $W_2B_5$, and/or $TiB_2$.

The oxide dispersoids may consist of $ZrO_2$, $TiO_2$, $Al_2O_3$, $ThO_2$ and/or $CeO_2$.

The nitride dispersoids may consist of BN, $Si_3N_4$, $W_2N_3$, ZrN, TiN and/or CrN.

Pursuant to the invention, such strip is prepared by using a starting material, which consists of nickel, copper, silver or their alloys as basic material and contains 0.2 to 5 atom percent of additive of elements, which can form oxides, nitrides, borides and/or carbides. This starting material is transformed into a single-layer or multi-layer metal strip. For the preparation of the multi-layer metal strip, a basic material without the aforementioned additive is used for at least on of the layers of this strip. After that, for the formation of a cubic texture, the strip is subjected to a recrystallization annealing under a partial pressure of oxygen, nitrogen, boron or carbon, which is above the equilibrium partial pressure of the oxides, nitrides, borides or carbides of the additive elements contained in the alloy, yet below the equilibrium partial pressure of oxides, nitrides, borides or carbides of the basic elements of nickel, copper and silver of the strip alloy.

Appropriately, a starting material is used, which contains, in the basic material, 1 to 2 atom percent of the additive elements, which can form oxides, nitrides, borides and/or carbides.

If the strip is annealed in oxygen is should be exposed to a temperature ranging from 750° to 1000° C.

With the inventive method, high-strength, biaxially textured metallic a strip of nickel, copper, silver or their alloys can be produced relatively easily. At the same time, it is of particular advantage that the strip for the transformation step of the process still has an advantageously low starting strength, since the strength increasing dispersoids are formed only during the final annealing treatment in the strip. Moreover since the dispersoids are formed only after the recrystallization, the formation of the cubic texture advantageously is not affected.

The inventive metal composite has very good properties with respect to an epitaxial coating with a biaxially textured layer and, at the same time, has a high tensile strength. The very good coating properties are due to the fact that the layer of the metal strip, intended for the epitaxial coating, is free of dispersoids, so that, at the surface of this layer, there are no oxide particles, which could interfere with the epitaxy. If one of the layers of composite consists of copper, the composite has a high electrical conductivity. The substrate composite is then suitable as a bypass for a superconducting layer, which is applied on the dispersion-free layer. In addition, due to the fact that copper is non-magnetic, the hysteresis losses are also kept small in the case of alternating current applications.

EXAMPLE 1

An alloy of nickel with 1 atom percent of aluminum is melted. The structure is homogenized by hot forming into a square at 1,100° C. and subsequently rolled with a degree of deformation of 99.8% to a strip 40 μm thick. The strip subsequently is annealed in a container at 900° C. for a period of 30 hours under a defined oxygen partial pressure. By the addition of a powder mixture of Ni and NiO to the container, the oxygen partial pressure is adjusted so that it corresponds to that of the decomposition reaction of the NiO and is clearly above the equilibrium partial pressure of the $Al_2O_3$. During this annealing, strength-increasing $Al_2O_3$ dispersoids are formed from the aluminum contained in the strip.

The finished strip has a high grade, cubic texture. The yield point of the strip is about 200 MPa, that is, 4.5 times higher than that of pure nickel.

EXAMPLE 2

An alloy of nickel with 1 atom percent of aluminum is melted. The structure is homogenized by hot forming into a square at 1,100° C. and subsequently rolled with degree of deformation of 99.8% to a strip 40 μm thick. The strip subsequently is annealed in a container at 900° C. for a period of 30 hours in a vacuum oven under a constant oxygen pressure of $10^{-3}$ Pa. During this annealing, strength-enhancing $Al_2O_3$ dispersoids are formed from the aluminum contained in the strip.

The strip has a high-grade cubic structure. The yield point is about 180 MPa.

EXAMPLE 3

An alloy of nickel with 1.5 atom percent of silicon is melted. The structure is homogenized by hot forming into a square at 1,100° C. and subsequently rolled with degree of deformation of 99.8% to a strip 40 μm thick. The strip subsequently is annealed in a container at 900° C. for a period of 30 hours under a defined oxygen partial pressure. By the addition of a powder mixture of Ni and NiO to the container, the oxygen partial pressure is adjusted so that it corresponds to that of the decomposition reaction of the NiO and is clearly above the equilibrium partial pressure of the $SiO_2$. During this annealing, strength-increasing $SiO_2$ dispersoids are formed from the silicon contained in the strip.

The strip, so produced has a high-grade cubic structure. The yield point is about 200 MPa.

EXAMPLE 4

A composite blank is produced first. It consists of a cylinder with a diameter of 30 mm and a pipe, which surrounds the cylinder and has an external diameter of 42 mm. Nickel with 1.5 atom percent of aluminum is used as material for the cylinder. The pipe consists of pure nickel.

This composite is forged into a cylinder 35 mm thick. Subsequently the cylinder is transformed at 1,100° C. into a billet with a square cross section and, with a degree of deformation 99.8%, rolled into a strip 40 μm thick. The latter is annealed for 30 hours at 900° C. By the addition of a powder mixture of Ni and NiO to the container, the oxygen partial pressure is adjusted so that it corresponds to that of the decomposition reaction of the NiO and is clearly above the equilibrium partial pressure of the $Al_2O_3$. During this annealing, strength-increasing $Al_2O_3$ dispersoids are formed from the aluminum contained in the nickel core of the strip.

The strip, so produced, has a nickel core, in which the $Al_2O_3$ dispersoids are contained. This core is surround by the sheath of pure nickel, which has a sharp cubic texture and is free of oxide particles.

The strip, so produced, has a yield point of 180 MPa.

EXAMPLE 5

A composite blank is produced first. It consists of a cylinder with a diameter of 30 mm and a pipe, which surrounds the cylinder and has an external diameter of 42 mm. Copper with 1.5 atom percent of aluminum is used as material for the cylinder. The pipe consists of pure nickel.

This composite is forged into a cylinder 35 mm thick. Subsequently the cylinder is homogenized at 1,100° C. and subsequently, with a degree of deformation 99.8%, rolled into a strip 40 μm thick. The latter is annealed for 30 hours at 900° C. By the addition of a powder mixture of Ni and NiO to the container, the oxygen partial pressure is adjusted so that it corresponds to that of the decomposition reaction of the NiO and is clearly above the equilibrium partial pressure of the $Al_2O_3$. During this annealing, strength-increasing $Al_2O_3$ dispersoids are formed from the aluminum contained in the copper core of the strip.

The strip, so produced, has a copper core, in which the $Al_2O_3$ dispersoids are contained. This core is surrounded by a sheath of pure nickel, which has a sharp cubic texture and is free of oxide particles.

The strip, so produced, has a yield point of 160 MPa.

EXAMPLE 6

A composite blank, consisting of a cylinder of the alloy $Ni_{93.5}W_5Al_{1.5}$ with a diameter of 30 mm and a pipe, which surrounds the cylinder, consisting of the alloy $Ni_{95}W_5$ and having an external diameter of 42 mm, initially is forged in a cylinder 35 mm thick. This is homogenized at 1,100° C. and subsequently, with a degree of deformation 99.8%, rolled into a strip 40 μm thick. The latter is annealed for 30 hours at 900° C. By the addition of a powder mixture of Ni and NiO to the container, the oxygen partial pressure is adjusted so that it corresponds to that of the decomposition reaction of the NiO and is clearly above the equilibrium partial pressure of the $Al_2O_3$. During this annealing, strength-increasing $Al_2O_3$ dispersoids are formed from the aluminum contained in the $Ni_{93.5}W Al_{1.5}$ core of the strip.

The strip, so produced, has a core of a NiW alloy, in which the $Al_2O_3$ dispersoids are contained. This core is surround by the sheath of pure nickel, which has a sharp cubic texture and is free of oxide particles.

The strip, so produced, has a yield point of 300 Mpa.

What is claimed is:

1. A single-layer or multi-layer metal strip for the epitaxial coating with a biaxially textured layer, wherein the latter comprises nickel, copper, silver or their alloys as basic material, the single-layer metal strip and, in the case of the multi-layer metal strip, at least one of its layers comprises 0.1 to 5% by volume of 10 nm to 5 μm large, strength-increasing dispersoids of carbides, borides, oxides and/or nitrides and the layers of a multi-layer metal strip forming a composite and at least one of the layers being free of dispersoids and having a biaxial texture.

2. The metal strip of claim 1, wherein the layers of the multi-layer metal strip comprises a uniform basic material or that at least one of the layer differs form the remaining ones with regard to the basic material.

3. The metal strip of claim 1, wherein the dispersoid-containing layer comprises copper, a copper alloy or a nickel alloy and the dispersoid-free, biaxially textured layer comprises nickel or a nickel alloy as basic material.

4. The metal strip of claim 1, wherein the carbide dispersoids comprises $Cr_4C$, $Cr_7C_3$, $Cr_3C_2$, $B_4C$, WC, $Mo_2C$, VC, NbC, TaC and/or TiC.

5. The metal strip of claim 1, wherein the boride dispersoids comprises of $AlB_{12}$, $ZrB_2$, $Co_3B$, $W_2B_5$, and/or $TiB_2$.

6. The metal strip of claim 1, wherein the oxide dispersoids comprises $ZrO_2$, $TiO_2$, $Al_2O_3$, $ThO_2$ and/or $CeO_2$.

7. The metal strip of claim 1, wherein the nitride dispersoids comprises BN, $Si_3N_4$, $W_2N_3$, ZrN, TiN and/or CrN.

8. A method for producing a single-layer or multi-layer metal strip as set forth in claim 1 wherein a starting material is used, which consists of nickel, copper, silver or their alloys as the basic material and contains 0.2 to 5 atom percent of an additive of elements, which form oxides, nitrides, borides and/or carbides, that a single-layer or a multi-layer strip is produced form this starting material by means of transforming methods, a basic material without the aforementioned additive being used in the preparation of the multi-layer metal strip for at least one of the layers of the strip, that subsequently the strip is subjected to a recrystallization annealing for forming a cubic texture and that finally the strip is subjected to an annealing under a partial pressure of oxygen, nitrogen, boron or carbon, the partial pressure being above the equilibrium partial pressure of the oxides, nitrides, borides and carbides of the additive elements contained in the alloy and below the equilibrium partial pressure of oxides, nitrides, borides and carbides of the basic elements nickel, copper and silver of the strip alloy.

9. The method of, wherein the starting material used comprises which contains, in nickel, copper, silver or their alloys as basic material, an addition of 1 to 2 atom percent of elements, which can form oxides, nitrides, borides and or carbides.

10. The method of, claim 8, wherein the strip, in the event that it is annealed in oxygen, is subjected to a temperature ranging from 750° to 1,000° C.

* * * * *